United States Patent
Voutsas et al.

(10) Patent No.: US 6,959,029 B2
(45) Date of Patent: Oct. 25, 2005

(54) APPARATUS FOR PERFORMING ANASTOMOSIS

(75) Inventors: Apostolos T. Voutsas, Vancouver, WA (US); Mark A. Crowder, Portland, OR (US); Yasuhiro Mitani, Osaka (JP)

(73) Assignee: Sharp Laboratories of America, Inc., Camas, WA (US)

( * ) Notice: Subject to any disclaimer, the term of this patent is extended or adjusted under 35 U.S.C. 154(b) by 94 days.

(21) Appl. No.: 10/897,763

(22) Filed: Jul. 22, 2004

(65) Prior Publication Data

US 2004/0259296 A1 Dec. 23, 2004

Related U.S. Application Data

(63) Continuation-in-part of application No. 10/113,144, filed on Mar. 27, 2002, now Pat. No. 6,792,029.

(51) Int. Cl.[7] .............................................. H01S 3/08
(52) U.S. Cl. .................. 372/103; 372/43; 372/44; 372/45; 372/46; 372/92; 438/478; 438/479; 438/480; 438/481; 438/482; 438/483; 438/484; 438/485; 438/486; 438/795
(58) Field of Search ................ 372/43–46, 92, 372/103; 438/478–486, 795

(56) References Cited

U.S. PATENT DOCUMENTS

| | | | |
|---|---|---|---|
| 5,119,113 A * | 6/1992 | Prakash et al. | 347/241 |
| 6,387,779 B1 * | 5/2002 | Yi et al. | 438/486 |
| 6,420,094 B1 * | 7/2002 | Haruki et al. | 430/311 |
| 2003/0171007 A1 * | 9/2003 | Voutsas et al. | 438/795 |
| 2004/0196446 A1 * | 10/2004 | Irie | 355/72 |
| 2004/0253819 A1 * | 12/2004 | You | 438/689 |
| 2004/0253840 A1 * | 12/2004 | You | 438/799 |
| 2005/0003591 A1 * | 1/2005 | Takaoka et al. | 438/151 |

OTHER PUBLICATIONS

J.S. Im et al.: Controlled Super-Lateral Growth of Si Films; Phys. Stat.sol.(1) 166, 1998, pp 603–617.*
J.S. Im et al.; Controlled Super-Lateral Growth of Si Films; Phys. Stat. sol.(1) 166, 1998, pp 603–617.*

* cited by examiner

Primary Examiner—Wilson Lee
Assistant Examiner—Leith Al-Nazer
(74) Attorney, Agent, or Firm—David C. Ripma; Joseph P. Curtin

(57) ABSTRACT

A wide-slit lateral growth projection mask, projection system, and corresponding crystallization process are provided. The mask includes an opaque region with at least one a transparent slit in the opaque region. The slit has a width in the range of 10X to 50X micrometers, with respect to a X:1 demagnification system, and a triangular-shaped slit end. The triangular-shaped slit end has a triangle height and an aspect ratio in the range of 0.5 to 5. The aspect ratio is defined as triangle height/slit width. In some aspects, the triangular-shaped slit end includes one or more opaque blocking features. In another aspect, the triangular-shaped slit end has stepped-shaped sides. The overall effect of the mask is to promote uniformly oriented grain boundaries, even in the film areas annealed under the slit ends.

37 Claims, 5 Drawing Sheets

Fig. 1 *(PRIOR ART)*
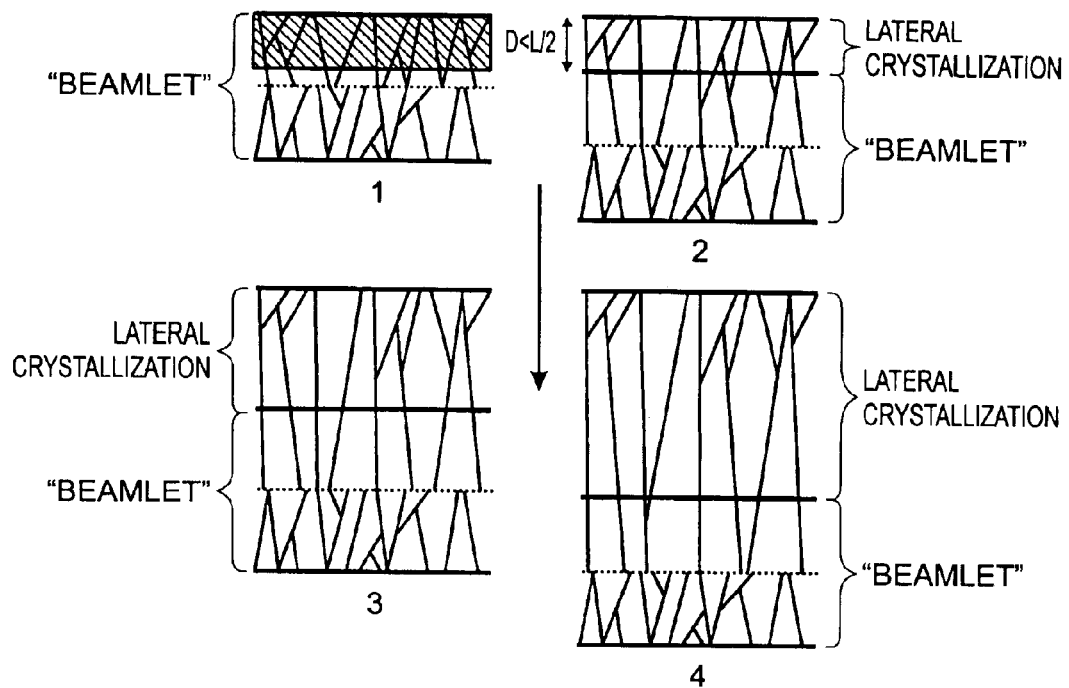
Fig. 2 *(PRIOR ART)*
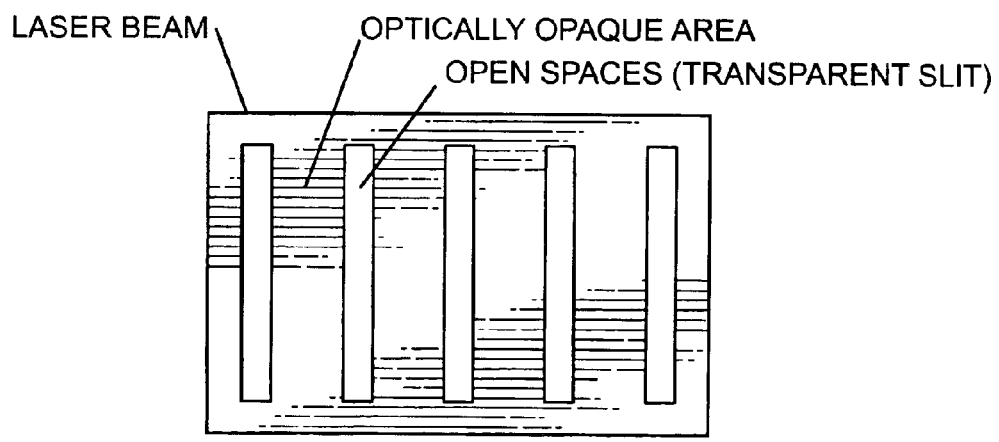

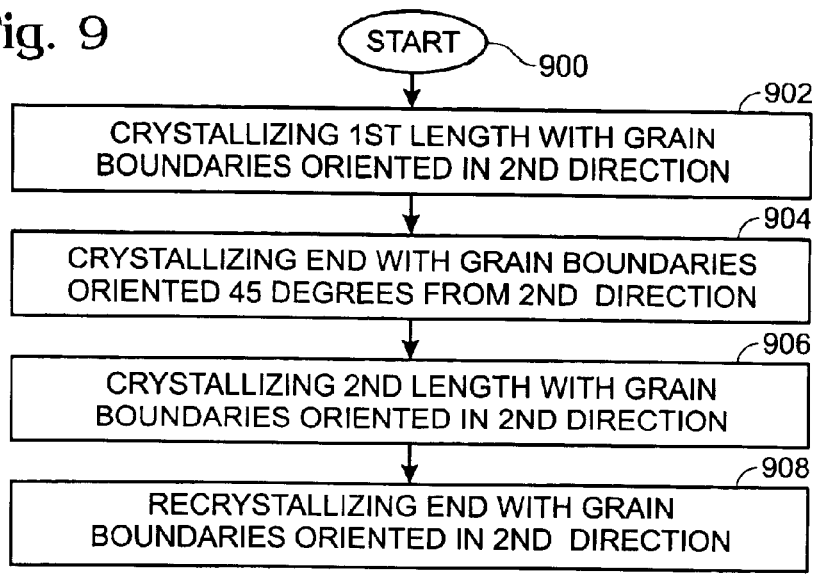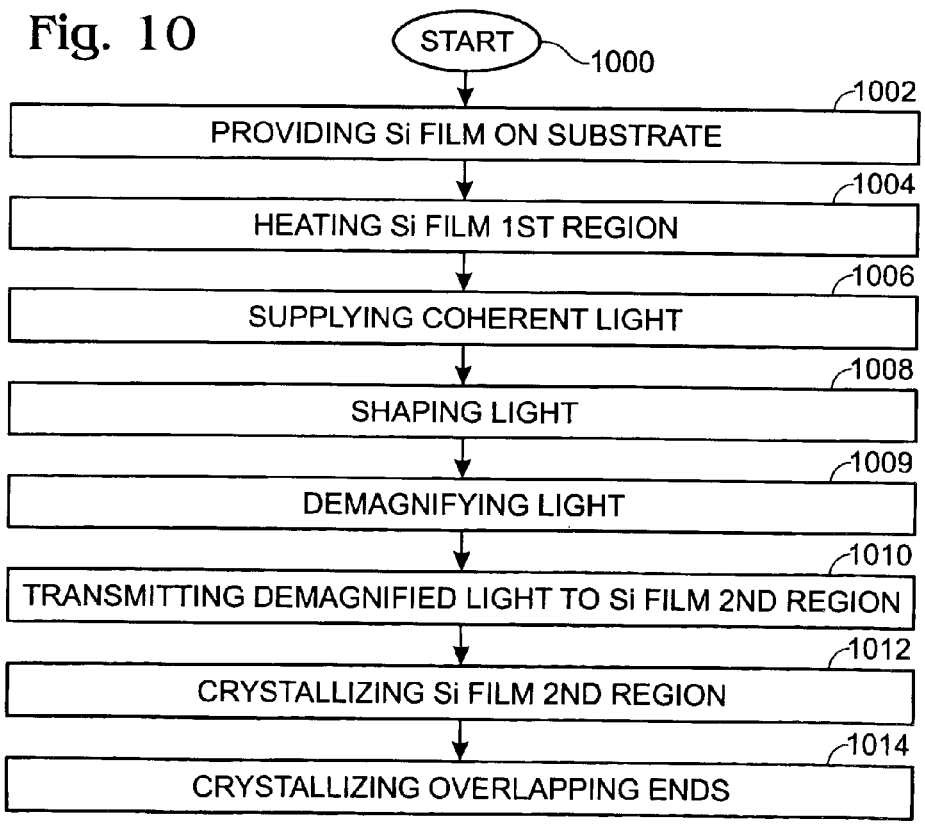

APPARATUS FOR PERFORMING ANASTOMOSIS

RELATED APPLICATIONS

This application is a continuation-in-part of a pending patent application entitled, METHOD FOR SUPPRESSING ENERGY SPIKES OF A PARTIALLY-COHERENT BEAM, invented by Voutsas et al., Ser. No. 10/113,144, filed Mar. 27, 2002 now U.S. Pat. No. 6,792,029.

BACKGROUND OF THE INVENTION

1. Field of the Invention

This invention generally relates to semiconductor fabrication processes and, more particularly, to a mask and corresponding process for crystallizing the mask slit end areas associated with lateral growth crystallization.

2. Description of the Related Art

When forming thin film transistors (TFTs) for use in liquid crystal display (LCD) or other microelectronic circuits, the location of transistors channel regions, the orientation of regular structured polycrystalline silicon (poly-Si) or single-grain-crystalline silicon, and the surface roughness are important issues. This poly-Si material can be used as the active layer of poly-Si TFTs in the fabrication of active-matrix (AM) backplanes. Such backplanes can be used in the fabrication of AM LCDs and can be also combined with other display technologies, such as organic light-emitting diode (OLED) displays.

Poly-Si material is typically formed by the crystallization of initially deposited amorphous Si (a-Si) films. This process can be accomplished via solid-phase-crystallization (SPC), for example, by annealing the a-Si films in a furnace at appropriate temperature and for sufficiently long time. Alternatively, laser annealing can also be used to achieve the phase transformation.

Conventionally, crystallization techniques are applied to a substrate in such a manner as to yield uniform poly-Si film quality throughout the substrate area. In other words, there is no spatial quality differentiation over the area of the substrate. The most important reason for this end result is the inability of conventional methods to achieve such quality differentiation. For example, when a-Si film is annealed in a furnace or by rapid-thermal-annealing, all of the film is exposed to the same temperature, resulting in the same quality of poly-Si material. In the case of conventional laser annealing, some differentiation is possible, but the price, in terms of loss of throughput, is very high for the modest performance gains realized.

Recently, a new laser annealing technique has been developed that allows for significant flexibility in the process techniques, permitting controlled variation in resulting film microstructure. This technique relies on lateral growth of Si grains using very narrow laser beams that are generated by passing a laser beam through a beam-shaping mask, and projecting the image of the mask to the film that is being annealed. The method is called Laser-Induced Lateral Crystallization (LILaC), sequential lateral solidification (SLS), or SLS/LILAC.

Conventional solid state (SSL) or continuous laser annealing processes, can be differentiated from LILAC processes by their use of relatively rapid repetition rates, on the order of 10 to 100 kHz, whereas LILaC processes typically use an Excimer laser with a repetition rate that rarely exceeds 300 Hz. Further, SSL processes cannot typically use a beam shaping mask, since a more strongly coherent light is sourced. The poly-Si material crystallized by the SSL or continuous laser annealing method consists of a large density of grains, and each grain is surrounded by grain boundary. The size of grains are typically ~1 micron (micrometer or $\mu$m). But the typical channel length of TFT is 2–30 microns, so it is inevitable that channel regions of TFT contain several grain boundaries. These grain boundaries act as electron and hole traps, and degrade the TFT characteristics and reliability. The LILAC process can form larger grain lengths between grain boundaries.

FIG. 1 is a diagram illustrating the LILaC process (prior art).

FIG. 2 illustrates a conventional LILaC beam shaping mask (prior art). Referencing FIGS. 1 and 2, the initially amorphous silicon film is irradiated by a very narrow laser beamlet, with typical widths of a few microns (i.e. 3–5 $\mu$m). Such small beamlets are formed by passing the original laser beam through a mask that has open spaces or apertures, and projecting the beamlets onto the surface of the annealed Si-film.

The sequence of images 1 through 4 illustrates the growth of long silicon grains. A step-and-repeat approach is used. The shaped laser "beamlet" (indicated by the 2 parallel, heavy black lines) irradiates the film and then steps by a distance smaller than half of the width of the slit. As a result of this deliberate advancement of each beamlet, grains are allowed to grow laterally from the crystal seeds of the poly-Si material formed in the previous step. This is equivalent to laterally "pulling" the crystals, as in zone-melting-crystallization (ZMR) method or other similar processes. As a result, the crystal tends to attain very high quality along the "pulling" direction, in the direction of the advancing beamlets. This process occurs simultaneously at each slit on the mask, allowing for rapid crystallization of the area covered by the projection of the mask on the substrate. Once this area is crystallized, the substrate moves to a new (unannealed) location and the process is repeated.

To control the grain boundary pulling, conventional LILaC apertures widths have been limited to no greater than 4 to 5 microns. When the aperture is greater than about 4 microns, the Si area furthest from the growing crystal seed spontaneously crystallizes in an undesirable pattern. That is, the slit width is limited by the lateral growth length.

Some poly-Si materials formed through the LILaC process have a highly periodical microstructure, where crystal bands of specific width are separated by high-angle grain boundaries. Within the crystal bands, low-angle boundaries are observed with a frequency of occurrence dependent upon certain specifics of the crystallization process, such as film thickness, laser fluence (energy density), pulse duration, and the like. TFTs fabricated on such poly-Si films demonstrate very good characteristics, as long as the direction of conduction is parallel to the direction of the in-crystal low-angle boundaries.

TFTs with greater electron mobility can be fabricated if the substrate crystallization characteristics can be made more isotropic. In other words, the TFT performance depends upon the angle between the main crystalline growth direction, the direction parallel to the laser scanning axis, and the TFT channel. This is due to the formation of sub-boundaries within the crystal domains. Therefore, by chance only, depending upon the relative size of the crystal domain and the TFT channel length, certain TFTs will not include grain-boundaries in their active area (channel), whereas other TFTs will include one or more boundaries in their active areas. This kind of non-uniformity is highly detrimental for critical-application TFTs where uniformity of characteristics is more essential than absolute performance.

If the angle of rotation between the lattice mismatch on the two sides of the boundary is less than approximately 15 degrees, the boundary is considered to be a low-angle boundary. An angle of rotation between 15 and 90 degrees is considered to be a high-angle boundary. Electron mobility between high-angle boundaries is impaired, while mobility between low-angle boundaries is usually insignificant. The step-and-repeat annealing typically promotes low-angle boundaries. However, the film regions corresponding to the mask edges, not being subject to the step-and-repeat process, are likely to form high-angle boundaries.

One embodiment of the SLS/LILaC process involves the use of a large array of narrow slits that simultaneously melt and solidify the Si thin film in such a way as to fully crystallize the entire film after two passes, stitching together crystallized strips. The mask, used to shape the beam, can in principal have a wide variety of patterns on it. The mask may comprise a patterned layer of chrome, or other material that blocks the desired wavelength effectively, on a quartz substrate, or other suitably transparent material at the wavelength of laser to be used. Common patterns consist of groups of rectangular shapes, including slits and chevrons.

As the laser beam is projected through these patterns, the intensity profile of the projected beam is determined by the features that make up the pattern and any optics used to image the pattern on the material. The intensity profile of the laser beam is typically not uniform over the entire pattern. For example, at corner regions intensity peaks have been noticed. These intensity peaks may cause local damage on the film irradiated by the shaped beam. One form of damage caused by intensity peaks is agglomeration, which may cause the silicon film to pull away from the region exposed to the high intensity peaks, possibly leaving a void or other non-uniformity.

One area of non-uniformity is associated with the mask slit ends. Even if the Si in the area underlying the slit ends is not damaged, the pattern of crystallization and grain boundaries are not as controlled as in the other slit areas. Thus, high performance TFTs cannot be fabricated in these slit end Si areas having uncontrolled crystallization boundaries.

It would be advantageous if a Si film could be uniformly crystallized using a lateral growth process, even in the areas underlying the mask slit ends.

It would be advantageous if a mask slit end could be modified to produce uniform and controlled grain boundaries.

It would be advantageous if the slit widths of lateral growth masks could be increased to improve the rate of Si film crystallization. It would be advantageous if the above-mentioned modified mask slit end could be adapted for use with a wide slit mask.

SUMMARY OF THE INVENTION

The present invention describes a mask, lateral growth crystallization system, and a corresponding crystallization method that produce controlled uniform grain boundary directions in the area of Si film underlying the mask slit ends. The mask slit end is triangularly shaped. Taking advantage of the fact that the Si film area underlying adjoining crystallization regions is annealed at least twice, the triangular-shaped slit end significantly reduces the lattice mismatch with the rest of the crystallized film (away from the slit ends) in a two-step process.

Accordingly, a projection mask is provided for use in a X:1 demagnification system. The mask comprises an opaque region with at least one a transparent slit in the opaque region. The slit has a width in the range of 10X to 50X micrometers and a triangular-shaped slit end. The triangular-shaped slit end has a triangle height and an aspect ratio in the range of 0.5 to 5. The aspect ratio is defined as triangle height/slit width. In some aspects, the triangular-shaped slit end includes one or more opaque blocking features. In another aspect, the triangular-shaped slit end has stepped-shaped sides. Typically, X is equal to 5.

Additional details of the above-described mask, a substrate temperature-assisted lateral growth process that takes advantage of a mask with a wide slit width and a triangular-shaped slit end, and a corresponding crystallization method are provided below.

BRIEF DESCRIPTION OF THE DRAWINGS

FIG. 1 is a diagram illustrating the LILaC process (prior art).

FIG. 2 illustrates a conventional LILaC beam shaping mask (prior art).

FIG. 9 is a flowchart illustrating the present invention method for crystallizing a silicon (Si) film.

FIG. 10 is a flowchart illustrating the present invention substrate temperature-assisted lateral growth method for crystallizing a substrate.

DETAILED DESCRIPTION OF THE PREFERRED EMBODIMENTS

Figure 4:
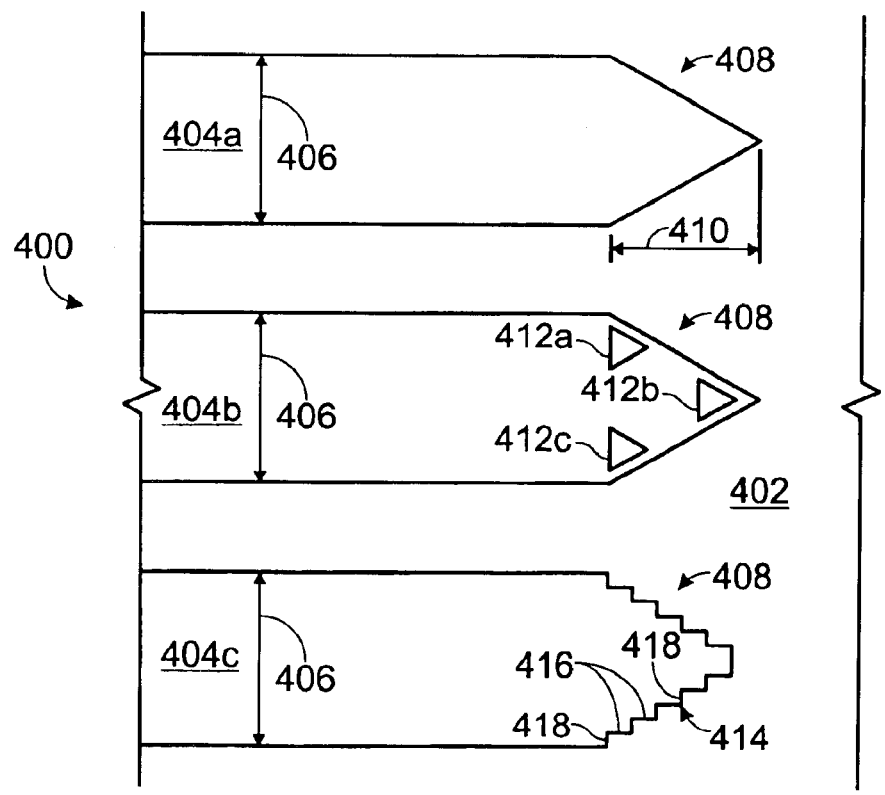
FIG. 4 is a plan view of a section of the present invention projection mask.

FIG. 4 is a plan view of a section of the present invention projection mask for use in an X:1 demagnification system. The mask 400 comprises an opaque region 402 and a transparent slit 404a in the opaque region 402. Also shown are parallel slits 404b and 404c. Although only three slits are shown, the present invention may include a plurality of parallely-aligned, end-to-end-aligned, or angled slits. For example, the angled slits may be aligned in perpendicular directions. The slit 404a has a slit width 406 in the range of 10X to 50X micrometers. More preferably, the slit width 406 is 10X to 30X micrometers. Even more preferably, the slit width 406 is 10X to 20X microns. The slit 404a as well as 404b and 404c, has a triangular-shaped slit end 408. In some aspects, the mask 400 is used in a system with a 5:1 demagnification factor lens. Then, the slit width 406 can vary from 50 to 250 microns. In a 1:1 system, where a lens is not used, the slit width varies from 10 to 50 microns.

The triangular-shaped slit end 408 has a triangle height 410 and an aspect ratio in the range of 0.5 to 5. The aspect ratio=triangle height 410/slit width 406.

Referencing slit 404b, the triangular-shaped slit end 404 may include an opaque blocking feature. As shown, the triangular-shaped slit end 404 may include a plurality of opaque blocking features 412a, 412b, and 412c. Although the three blocking features are shown, the invention is not limited to any particular number. Although the features 412a, 412b, and 412c are shown as triangles, the invention is not limited to any particular shape. For example, round, rectangular, or square shapes are possible. Neither is the invention limited to any particular placement of the blocking features.

Referencing slit 404c, the triangular-shaped slit end 408 has stepped-shaped sides 414. The invention is not limited to any particular step run 416, step rise 418, or number of steps. The use of opaque blocking features and stepped sides is typically for the purpose of eliminating or reducing light peak intensities in the slit end regions. This phenomena and solutions are presented in a related application METHOD FOR SUPPRESSING ENERGY SPIKES OF A PARTIALLY-COHERENT BEAM, from which this application continues.

Figure 5:
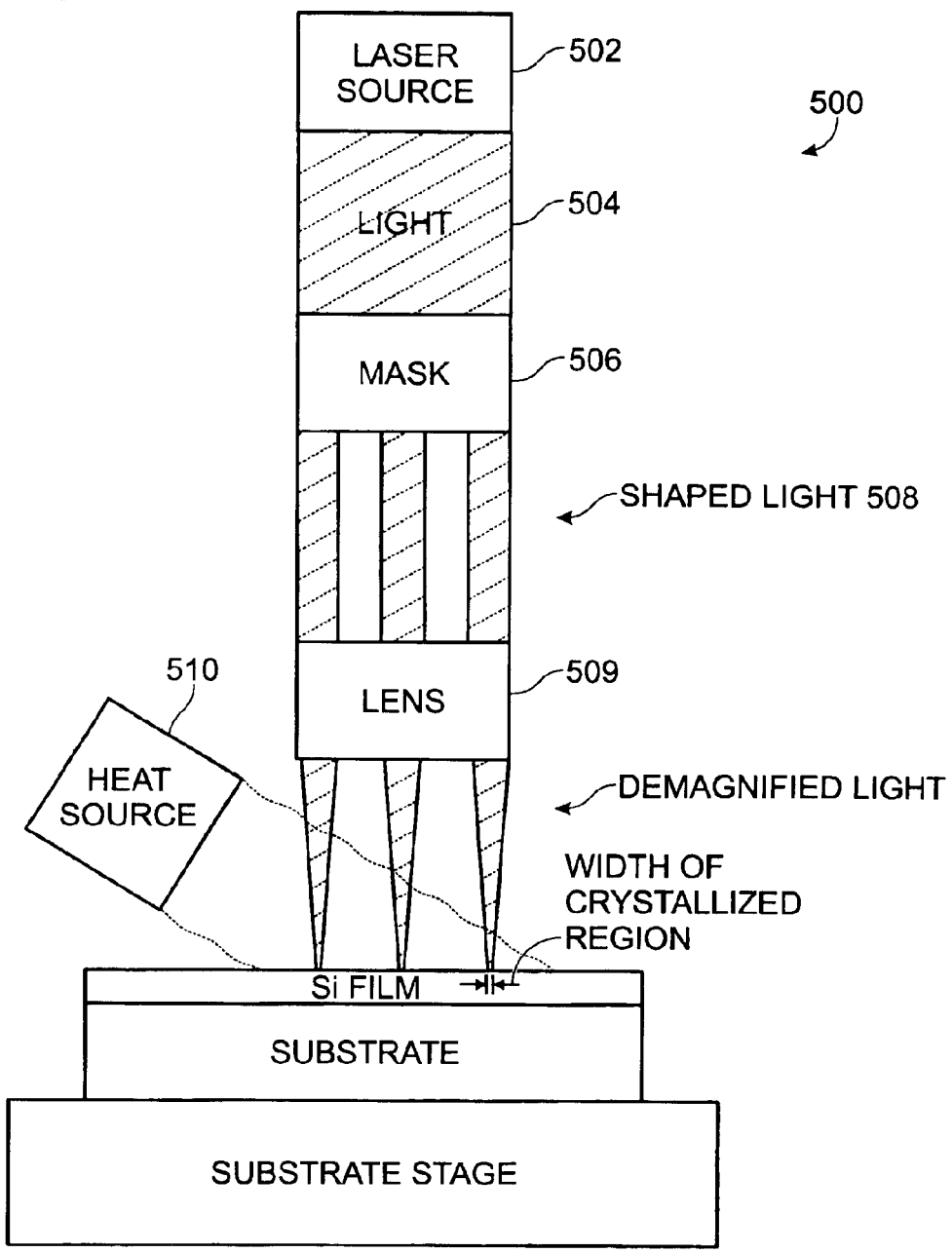
FIG. 5 is a schematic block diagram illustrating the present invention optical projection system.

FIG. 5 is a schematic block diagram illustrating the present invention optical projection system. The system 500 comprises a laser source 502 radiating coherent light 504. A projection mask 506 accepts light 504 from the laser source 502 and transmits shaped light 508. The mask details were presented above in the explanation of FIG. 4 and will not be repeated here in the interest of brevity. The laser source may be an Excimer laser having a wavelength of 308 nanometers (nm) or a Kryptofluoride (KrF) laser having a wavelength of 248 nm.

In one aspect, a lens 509, having a minimum resolution and a demagnification factor of X:1, is interposed between the projection mask 506 and a silicon film 514. The minimal resolution is the smallest-sized feature that can be resolved using coherent light through the feature, and is dependent upon factors such as the numerical aperture (NA) of the lens 509 and the wavelength of the light 504. An NA of 0.13 is typical. In this aspect, the triangular-shaped slit end includes one or more sub-resolutional opaque blocking features, see FIG. 4.

In some aspects, the system further comprises a substrate heat source 510. As shown, the substrate heat source 510 is a CO2 laser transmitting unshaped light. That is, the CO2 laser transmits light directly, without an intervening mask. Alternately but not shown, light from the CO2 laser may be transmitted through a wide aperture mask. As another alternative, the heat source may be an Excimer lamp, or lamp set (not shown) that irradiates either the top surface 512 of the silicon film 514 or the bottom surface 516 of a substrate 518 underlying the Si film 514. In another aspect, the heat source is a furnace (not shown) that encompasses the Si film 514/substrate 518. As explained in more detail below, the use of a heat source to elevate the temperature of the Si film 514 increases the lateral growth length, permitting the use of masks with larger slit widths.

If the lens 509 has a demagnification of 5:1, then the mask slit width (see FIG. 4) may vary from 50 to 250 microns. In some aspects of the system 500, a lens is not used. In this case, the system is a 1:1 projection system, and can be thought of as having a demagnification factor of 1. Although lens 509 is shown in the figure, the invention is also intended for use in systems without a lens (1:1 projection system).

Functional Description

Several families of designs can be used to modify the corner region (slit end) to reduce the intensity peak, while controlling the grain boundary orientations, so that desirable boundary orientations are obtained in the slit end regions after two or more passes with a laser. A first family of designs modifies the outline of the slit to form a triangular region, both with and without beam blocking features. Another family of designs modifies the outline of the slit by using a stepped triangular region, along with the possible addition of blocking features. Although the invention is explained using triangular-shaped slit ends, it should be understood that other slit ends shapes may also be possible, such as semi-circular and oval shapes. The dimensions provided here are illustrative as the critical dimensions and spacing of blocking features depend on the projection system to be used.

Figure 6:
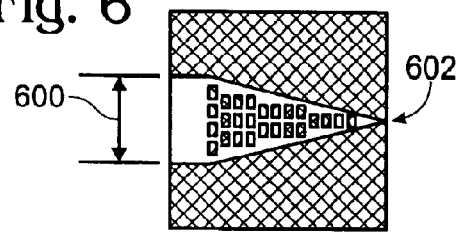
FIG. 6 is a plan view of a variation of the mask of FIG. 4.

FIG. 6 is a plan view of a variation of the mask of FIG. 4. In this variation, rectangular-shaped blocking features are used. The minimal resolution of the system is small relative to the slit width. That is, the slit width is an order of magnitude larger than the minimal resolution. Therefore, the blocking features are relatively small, as compared to the slit width. As shown, the slit width 600 is 110 microns and the minimum resolution (after a 5:1 demagnification lens) is 3 microns. The blocking feature rectangles have 5 and 10-micron dimensions (sides), and are separated by a distance of 10 microns. Some of the rectangles are positioned so that one of their sides is approximately 10 micrometers from the edge of the triangular-shaped slit end 602. These sides may be substantially parallel to the slit edge, as shown. In other aspects not shown, the blocking features can be a combination of shapes, for example, rectangular blocking features adjacent triangular blocking features. In another aspects not shown, rectangular, square, triangular or other appropriate shaped blocking features can be added to a stepped triangular-shaped slit end.

The dimensions of the blocking features depend upon the resolution of the optical system that is used to image the mask onto the substrate. The resolution depends upon the numerical aperture (NA) of the optical system. The higher the NA; the higher the resolution will be (i.e. the optical system will be able to resolve finer features). For example using a numerical aperture of 0.13 or minimal resolution of approximately 1.6 to 2 micrometers, the blocking feature dimension that optimizes the intensity profile (minimizes spikes) is on the order of 5×(0.35 to 0.7) micrometers, assuming a 5:1 demagnification. Further optimization may narrow the critical blocking feature dimension range to between approximately 5×(0.4 and 0.6) micrometers, and 2.5 micrometers may be optimal. Note, the blocking feature dimension that minimizes spikes need not necessarily lead to the optimum control of grain boundary orientations. That is, the blocking features may be optimized for considerations other than light intensity.

Figure 3:
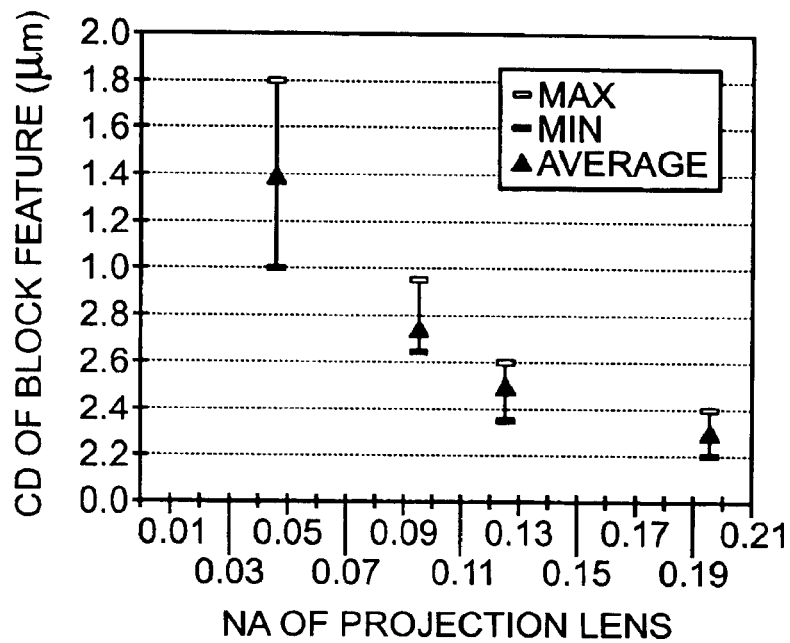
FIG. 3 is a plot showing the critical dimension of blocking features, normalized for the system demagnification factor.

FIG. 3 is a plot showing the critical dimension of blocking features, normalized for the system demagnification factor. As the NA of the optical system changes, the optimum blocking feature dimension-range will also change. Therefore, the optimum block dimension-range can be plotted as a function of the NA of the imaging system, as shown. The examples given correspond to an optical system with an NA of 0.13. The plot also shows the critical dimensions of blocking features for projections lenses having both larger and smaller numerical apertures than the NA of 0.13.

Depending on the NA of the optical system, the critical dimension for the size, or width, of blocking features and the spaces between features and other portions of the slit will fall within a range. For ease of illustration a single value has been used for the both the blocking feature size and the space between blocking features in the above examples, however, it is possible for the sizes of the blocking features to be different from each other, and for the spaces between blocking features be different sizes than the features themselves. The term critical dimension corresponds to a range of sizes, and the features and spaces may have varying sizes, preferably sizes, or widths, within the critical dimension range.

Figure 7A:
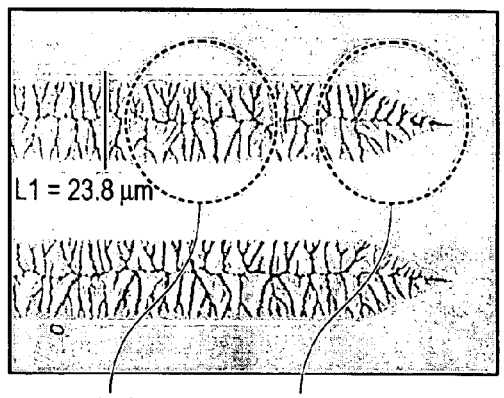
FIGS. 7A and 7B are plan views showing a Si film being crystallized in a lateral growth process.
Figure 7B:
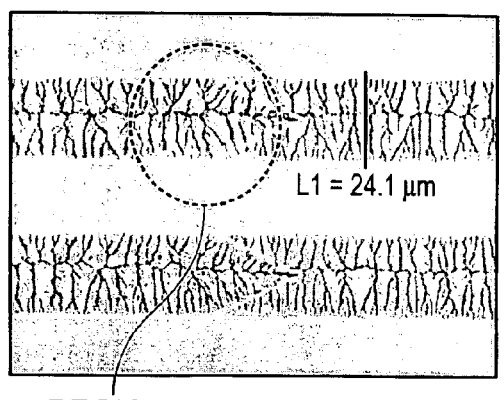

FIGS. 7A and 7B are plan views showing a Si film being crystallized in a lateral growth process.

Figure 8A:
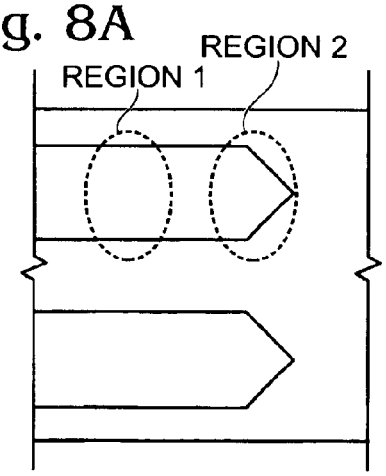
FIGS. 8A and 8B are plan views of the mask regions, for reference to FIGS. 7A and 7B.
Figure 8B:
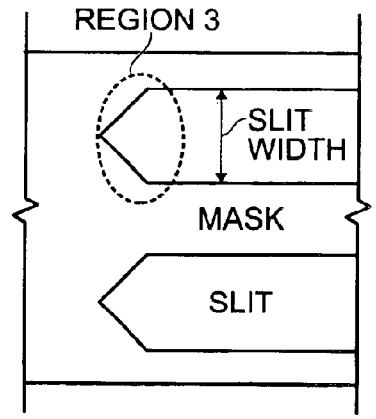

FIGS. 8A and 8B are plan views of the mask regions, for reference to FIGS. 7A and 7B. In FIG. 7A, the slit width is approximately 24.2 microns, so that the lateral growth length is about 12 microns. The polycrystalline region, with crystal grain boundaries, is shown surrounded by an amorphous region. The polycrystalline region is formed using a single laser pulse through a mask such as shown in FIG. 8A. The crystal grains are substantially aligned perpendicular to the length of the slit, for example in Region 1. Region 1 in the film is formed in response to Region 1 of the mask. However, in the end region identified as Region 2, an angled crystal pattern is clearly visible. Alternately stated, this pattern is at a 45 degree angle with respect to the boundary orientation in Region 1, and at about a 45 degree angle to the slit length. Region 2 is formed in response to the slit end, or Region 2 of the mask.

Referring now to FIG. 7B, the polycrystalline region is shown after completing a multi-pass laser annealing scan using the mask of FIG. 8B. Region 3, which corresponds to overlapping end regions, shows the crystal grain boundaries aligned essentially in the same direction as the grain boundaries of Region 1.

FIG. 9 is a flowchart illustrating the present invention method for crystallizing a silicon (Si) film. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 900.

Step 902 initially crystallizes a first length of Si, oriented in a first direction, with grain boundaries oriented substantially in a second direction, normal to the first direction. See Region 1 of FIG. 7A. Step 904 simultaneously (with Step 902) crystallizes a triangular-shaped end of the first length of Si with grain boundaries oriented substantially in a third direction, approximately 45 degrees from the first and second directions. See Region 2 of FIG. 7A. Step 906 subsequently crystallizes a second length of Si, adjacent the triangular shaped end and oriented in the first direction, with grain boundaries oriented substantially in the second direction. See the crystallized area to the right of Region 3 in FIG. 7B. Step 908 simultaneously (with Step 906) recrystallizes the triangular-shaped end with grain boundaries oriented substantially in the second direction. See Region 3 of FIG. 7B. In one aspect, simultaneously recrystallizing the triangular-shaped end with grain boundaries oriented substantially in the second direction (Step 908) includes forming grain boundaries having a lateral growth length in the range of 10 to 25 micrometers. Steps 902 and 906 also form grain boundaries with a lateral growth length in the range of 10 to 25 micrometers.

FIG. 10 is a flowchart illustrating the present invention substrate temperature-assisted lateral growth method for crystallizing a substrate. The method starts at Step 1000. Step 1002 provides a silicon (Si) film overlying a substrate. The invention has particular relevance to substrates with low melting temperatures such as glass, plastic, thin metal foil, quartz, or silicon. Step 1004 heats a first Si film region to a predetermined minimum temperature. Alternately, Step 1004 heats the substrate region underlying the first Si film region. In one aspect Step 1004 heats the first region of the Si film to a minimum temperature of 600 degrees C. In another aspect, Step 1004 heats the first region of the Si film to a temperature in the range of 600 to 1200 degrees C. Temperatures in the range of 800 to 1200 degrees C, and 1000 to 1200 degrees C are also possible. It should be noted that higher temperatures are often preferable, as they may be associated with a longer lateral growth length.

Step 1006 supplies coherent light. For example, coherent light can be supplied at a wavelength of 308 or 248 nanometers. Step 1008 shapes the light using a projection mask having a slit width in the range of 10X to 50X micrometers. Step 1009 demagnifies the shaped light by a factor of X. Step 1010 transmits the demagnified light to a second region of the Si film, within the first region. Alternately stated, the first region is larger than the second region, and encompasses the second region. Step 1012 crystallizes the second Si film region in response to the combination of the minimum substrate temperature and the demagnified light.

In one aspect, shaping the light using a projection mask in Step 1008 includes using a mask with a triangular-shaped slit end, and transmitting the demagnified light to a second region of the Si film in Step 1010 includes sequentially transmitting the demagnified light to adjacent Si film regions. Then, a further step, Step 1014, crystallizes overlapping ends from adjacent Si film regions in response to the combination of the minimum substrate temperature and the demagnified light transmitted through the triangular-shaped slit end.

In some aspects, shaping the light using a projection mask in Step 1008 includes using a mask with a slit width in the range of 10X to 30X micrometers. In other aspects, the slit width is in the range of 10X to 20X micrometers.

In one aspect, using a mask with triangular-shaped slit end (Step 1008) includes the triangular-shaped slit end having an aspect ratio in the range of 0.5 to 5;

where aspect ratio=triangle height/slit width (triangle base).

In another aspect, heating the first region of Si film to a predetermined minimum temperature in Step 1004 includes supplying unshaped light at a wavelength in the range between 9 and 11 micrometers. A CO2 laser provides light in this wavelength band. As noted above, Excimer lamps and furnaces may also be used to heat the Si film.

In one aspect, demagnifying the shaped light in Step 1009 includes supplying light focused with a minimal resolution and shaping the light using a projection mask with a triangular-shaped slit end (Step 1008) includes shaping the light using a sub-resolutional blocking feature in the triangular-shaped slit end. In another aspect, Step 1008 shapes the light with a triangular-shaped slit end with stepped-shaped sides.

A lateral growth mask has been presented having a slit width that is an order of magnitude larger than the resolution of the projection system. The mask also has a triangular-shaped slit end. Examples have been given of particular slits, features, and dimensions. However, the invention is not limited to just these examples. Other variations and embodiments of the invention will occur to those skilled in the art.

We claim:

1. In an X:1 demagnification factor system, where X is a variable, a projection mask comprising:

an opaque region;

a transparent slit in the opaque region including:

a rectangular region with a slit width in the range of 10X to 50X micrometers; and, a triangular-shaped slit end, formed on an end of the rectangular region.

2. The mask of claim 1 wherein the triangular-shaped slit end has a triangle height and an aspect ratio in the range of 0.5 to 5;

where aspect ratio=triangle height/slit width.

3. The mask of claim 1 wherein the triangular-shaped slit end includes an opaque blocking feature.

4. The mask of claim 3 wherein the triangular-shaped slit end further includes a plurality of opaque blocking features.

5. The mask of claim 1 wherein the triangular-shaped slit end has stepped-shaped sides.

6. The mask of claim 1 wherein the transparent slit has a width in the range of 10X to 30X micrometers.

7. The mask of claim 6 wherein the transparent slit has a width in the range of 10X to 20X micrometers.

8. The mask of claim 1 wherein the system has a demagnification factor of 5:1; and, wherein the transparent slit has a width in the range of 50 to 250 micrometers.

9. An optical projection system comprising:

a laser source radiating coherent light;

a projection mask to accept light from the laser source and transmit shaped light, the mask including:

an opaque region;

a transparent slit having:

a width in the range of 10X to 50X micrometers, where X is a variable; and, a triangular-shaped slit end; and, an X:1 demagnification factor lens having an input to accept the shaped light and an output to supply demagnified light.

10. The system of claim 9 further comprising:

a substrate heat source.

11. The system of claim 10 wherein the substrate heat source is a CO2 laser transmitting unshaped light.

12. The system of claim 9 wherein the transparent slit has a width in the range of 10X to 30X micrometers.

13. The system of claim 12 wherein the transparent slit has a width in the range of 10X to 20X micrometers.

14. The system of claim 9 wherein the triangular-shaped slit end has a triangle height and an aspect ratio in the range of 0.5 to 5;

where aspect ratio=triangle height/slit width.

15. The system of claim 9 wherein the lens has minimal resolution; and, wherein the triangular-shaped slit end includes a sub-resolutional opaque blocking feature.

16. The system of claim 15 wherein the triangular-shaped slit end further includes a plurality of sub-resolutional opaque blocking features.

17. The system of claim 9 wherein the triangular-shaped slit end has stepped-shaped sides.

18. The system of claim 9 wherein the laser source has a wavelength of 308 nanometers (nm).

19. The system of claim 9 wherein the laser source has a wavelength of 248 nm.

20. The system of claim 9 wherein the lens has a 5:1 demagnification factor; and, wherein the transparent slit has a width in the range of 50 to 250 micrometers.

21. A substrate temperature-assisted lateral growth method for crystallizing a substrate, the method comprising:

providing a silicon (Si) film overlying a substrate;

heating a first Si film region to a predetermined minimum temperature;

supplying coherent light;

shaping the light using a projection mask having a slit width in the range of 10X to 50X micrometers, where X is a variable;

demagnifying the shaped light by a factor of X;

transmitting the demagnified light to a second region of the Si film, within the first region; and, crystallizing the second Si film region in response to the combination of the minimum substrate temperature and the demagnified light.

22. The method of claim 21 wherein shaping the light using a projection mask includes using a mask with triangular-shaped slit end;

wherein transmitting the demagnified light to a second region of the Si film includes sequentially transmitting the demagnified light to adjacent Si film regions; and, the method further comprising:

crystallizing overlapping ends from adjacent Si film regions in response to the combination of the minimum substrate temperature and the demagnified light transmitted through the triangular-shaped slit end.

23. The method of claim 22 wherein using a mask with triangular-shaped slit end includes the triangular-shaped slit end having an aspect ratio in the range of 0.5 to 5;

where aspect ratio=triangle height/slit width.

24. The method of claim 22 wherein demagnifying the shaped light by a factor of X includes supplying light focused with a minimal resolution; and, wherein shaping the light using a projection mask with a triangular-shaped slit end includes shaping the light using a sub-resolutional blocking feature in the triangular-shaped slit end.

25. The method of claim 22 wherein shaping the light using a projection mask with a triangular-shaped slit end includes shaping the light with a triangular-shaped slit end with stopped-shaped sides.

26. The method of claim 21 wherein shaping the light using a projection mask includes using a mask with a slit width in the range of 10X to 30X micrometers.

27. The method of claim 21 wherein shaping the light using a projection mask includes using a mask with a slit width in the range of 10X to 20X micrometers.

28. The method of claim 21 wherein heating the first region of Si film to a predetermined minimum temperature includes supplying unshaped light at a wavelength in the range between 9 and 11 micrometers.

29. The method of claim 21 wherein providing a Si film overlying a substrate includes providing a substrate selected from the group including glass, plastic, thin metal foil, quartz, and silicon.

30. The method of claim 21 wherein heating the first region of the Si film to a predetermined minimum temperature includes heating the first region of the Si film to a minimum temperature of 600 degrees C.

31. The method of claim 30 wherein heating the first region of the Si film to a minimum temperature of 600 degrees C includes heating the first region to a temperature in the range of 600 to 1200 degrees C.

32. The method of claim 30 wherein heating the first region of the Si film to a minimum temperature of 600 degrees C includes heating the first region to a temperature in the range of 800 to 1200 degrees C.

33. The method of claim 30 wherein heating the first region of the Si film to a minimum temperature of 600 degrees C includes heating the first region to a temperature in the range of 1000 to 1200 degrees C.

34. The method of claim 21 wherein supplying a coherent light includes supplying light at a wavelength selected from the group including 308 and 248 nanometers.

35. The method of claim 21 wherein demagnifying the shaped light by a factor of X includes demagnifying by a factor of 5; and, wherein shaping the light using a projection mask includes using a mask with a slit width in the range of 50 to 250 micrometers.

36. A method for crystallizing a silicon (Si) film, the method comprising:

initially crystallizing a first length of Si, oriented in a first direction, with grain boundaries oriented substantially in a second direction, normal to the first direction;

simultaneously crystallizing a triangular-shaped end of the first length of Si with grain boundaries oriented substantially in a third direction, approximately 45 degrees from the first and second directions.

subsequently crystallizing a second length of Si, adjacent the triangular shaped end and oriented in the first direction, with grain boundaries oriented substantially in the second direction; and, simultaneously recrystallizing the triangular-shaped end with grain boundaries oriented substantially in the second direction.

37. The method of claim 36 wherein simultaneously recrystallizing the triangular-shaped end with grain boundaries oriented substantially in the second direction includes forming grain boundaries having a lateral growth length in the range of 10 to 25 micrometers.

* * * * *